United States Patent [19]
Mastrocola et al.

[11] Patent Number: 5,847,576
[45] Date of Patent: Dec. 8, 1998

[54] LOW POWER, VARIABLE LOGIC THRESHOLD VOLTAGE, LOGIC GATES

[75] Inventors: Angelo Rocco Mastrocola, West Lawn; Scott Wayne McLellan, Albany Township, both of Pa.

[73] Assignee: Lucent Technologies Inc., Murray Hill, N.J.

[21] Appl. No.: 746,261

[22] Filed: Nov. 7, 1996

[51] Int. Cl.[6] .................... H03K 19/003; H03K 19/094; H03K 19/20; H03K 19/082
[52] U.S. Cl. ............................ 326/31; 326/121; 326/124
[58] Field of Search .................................. 326/31, 34, 83, 326/121, 112, 119

[56] References Cited

U.S. PATENT DOCUMENTS

| | | | |
|---|---|---|---|
| 3,914,702 | 10/1975 | Gehweiler | 326/121 |
| 4,672,243 | 6/1987 | Kirsch | 307/475 |
| 5,144,167 | 9/1992 | McClintock | 307/475 |

OTHER PUBLICATIONS

Horenstein, Microelectronic Circuits & Devices, Prentice-Hall Inc., pp. 753–755, 1990.

*Primary Examiner*—Michael J. Tokar
*Assistant Examiner*—Daniel D. Chang
*Attorney, Agent, or Firm*—Scott W. McLellan

[57] ABSTRACT

A logic gate arrangement having a master gate or section for controlling the logic threshold voltage of slave gates responsive to the master. Both the master and slave gates have two opposite conductivity type transistors disposed in combination with a logic function circuit. The transistors have a common gate connection to a control input. Varying the voltage on the control input varies the logic threshold voltage of the gate. The logic function in the master gate is typically an inverter, with input and output connected together and driving the control inputs of the slave gates. The logic function of the slave gates may be a variety of different logic functions. The logic threshold voltage of the slave gates is substantially the same as a voltage applied to the control input of the master gate.

12 Claims, 3 Drawing Sheets ial logic threshold voltages.

2. Description of the Prior Art

Variable logic threshold logic gates are well known in the art. Such gates may be used in multivalued logic designs, input buffers, or as voltage level translators. For example, see U.S. Pat. No. 5,144,167 and U.S. Pat. No. 4,672,243 (assigned to the same assignee as this invention.) The gates in these examples are inverting buffers (referred to herein generally as gates, buffers or inverters), used as CMOS or transistor-transistor logic (TTL) compatible input buffers for CMOS logic. Each of the gates generally have what is referred to herein as a logic threshold voltage, the approximate input signal voltage level which causes the output of the gate to change. The logic threshold voltage of the inverters is set to a value based on the expected logic level input signal voltage range. For TTL logic signals, the logic threshold voltage is set to approximately 1.4 volts, while for CMOS logic signals (typically having power supply rail to power supply rail logic levels) the logic threshold is typically set to one-half the power supply voltage, e.g., 2.5 volts for 5 volt and ground power supplies.

The logic gate shown in the U.S. Pat. No. 5,144,167 may conduct significant power supply current drain when being driven by a minimum voltage TTL logical "high" signal (approximately 2.0 volts) regardless of the logic threshold voltage of the gate. This current drain may be objectionable where low power is needed or when many such gates are provided on a single chip. The logic gate shown in U.S. Pat. No. 4,672,243 is an improvement but is a complex design.

Therefore, it is desirable to provide a variable logic threshold logic gate design that allows for low current consumption while being simple in design.

SUMMARY OF THE INVENTION

This and other aspects of the invention may be obtained generally in an integrated circuit logic gate having a logic threshold voltage. The logic gate includes at least one transistor of a first conductivity type and at least one transistor of a second conductivity type in combination to provide the desired logic function. A transistor of the first conductivity type, responsive to a control signal, has outputs in series with the at least one transistor of the first type. An additional transistor of the second conductivity type, responsive to the control signal, has outputs in series with the at least one transistor of the second conductivity type. The logic threshold voltage of the logic gate varies in response to the control signal.

Alternatively, the logic gate includes a logic function and first and second transistors. The logic function has at least one input and at least one output, and first and second power nodes. Each transistor has a control terminal and two output terminals. The output terminals of the first transistor connects between a first power supply rail and the first power node while the two output terminals of the second transistor connects between a second power supply rail and the second power node. The control terminals of the transistors are connected together and couple to a control signal input for adjusting the logic threshold voltage of the logic gate.

Multiple logic gates may have a commonly controlled logic threshold voltage by connecting together the control signal inputs of the (slave) gates and driving them with a control signal derived from one of such logic gates with its input and output connected together, designated a master gate or section. A voltage applied to the control signal input of the master gate forces the logic threshold voltages of the various slave gates to be substantially equal to the applied voltage.

BRIEF DESCRIPTION OF THE DRAWING

The foregoing features of this invention, as well as the invention itself, may be more fully understood from the following detailed description of the drawings, in which.

DETAILED DESCRIPTION

Figure 2:
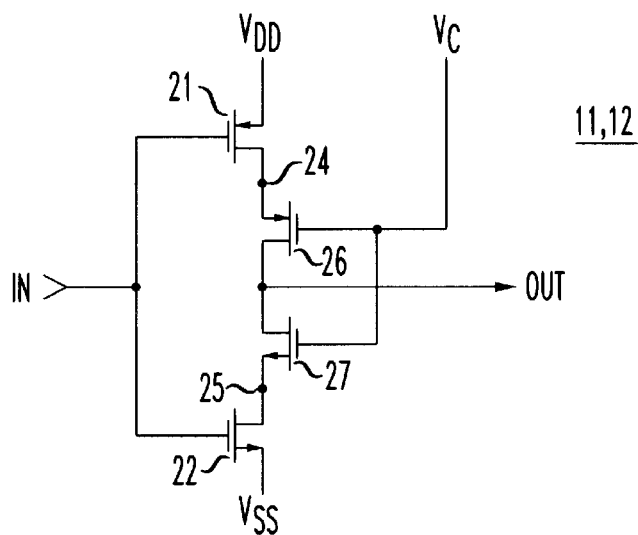
FIG. 2 is an exemplary circuit diagram of the buffer and master gate control circuit shown in FIG. 1.

Generally, the invention may be understood by referring to FIG. 2. As discussed below in more detail and in accordance with one embodiment of the invention, a variable logic threshold voltage logic function 12 is shown as having a logic function circuit of at least one transistor 21 of a first conductivity type and at least one transistor 22 of a second conductivity type in combination to provide the desired logic function, here an inverter. A transistor 26 of the first conductivity type, responsive to a control signal Vc, has outputs in series with transistor 21. An additional transistor 27 of the second conductivity type, also responsive to the control signal Vc has outputs in series with the transistor 22. The logic threshold voltage of the logic gate varies in response to the control signal.

Figure 4:
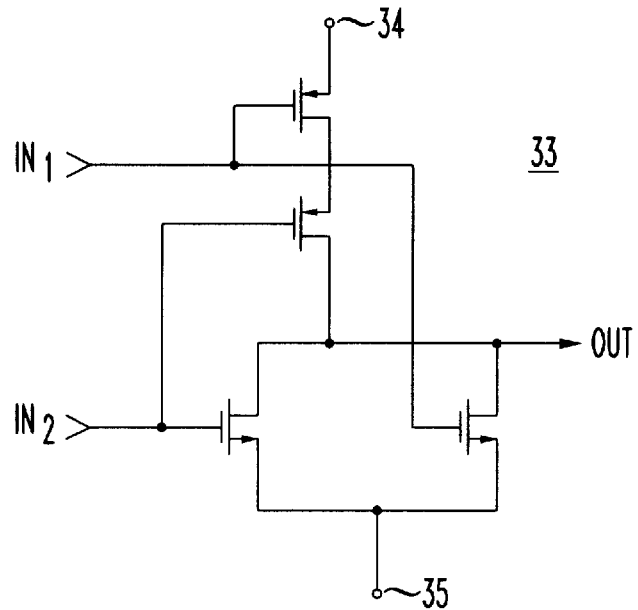
FIG. 4 is an exemplary circuit diagram of a NOR logic circuit suitable for inclusion in the logic circuit shown in FIG. 3.
Figure 5:
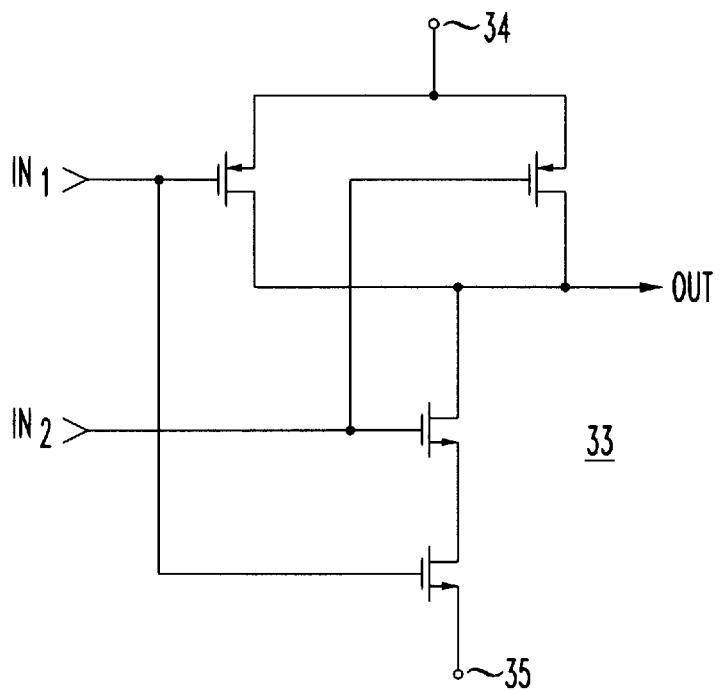
FIG. 5 is an exemplary circuit diagram of a NAND logic circuit suitable for inclusion in the logic circuit shown in FIG. 3.

The logic circuit (inverter) formed by transistors 21 and 22 may include additional transistors to implement a variety of logical functions, such as a NOR function (FIG. 4), a NAND function (FIG. 5).

Figure 1:
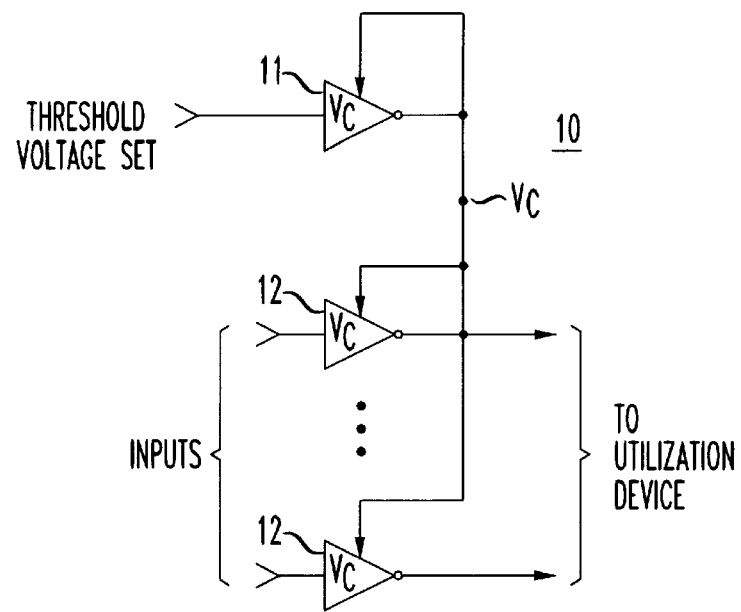
FIG. 1 is an exemplary circuit diagram of a multiple line input buffer and master gate control circuit arrangement having a common adjustable logic threshold voltage according to one embodiment of the invention.

In more detail, a multiple line, variable logic threshold voltage buffer circuit 10 is shown in FIG. 1 as one exemplary embodiment of the invention. A master gate control circuit 11 generates a common control signal Vc to control the logic threshold voltage of a plurality of slave logic gates 12 (shown here as inverters). This arrangement of multiply controlled gates 12 is useful in, for example, bus interfaces where groups of signals are either, for example, TTL level logic signals or CMOS level logic signals and the logic threshold voltage of the buffers (inverters) should all be substantially the same. As will be explained in more detail below, the master circuit 11 is typically substantially similar to the slave gates 12.

The master circuit 11 and each of the slave gates 12 have a conventional logic input(s) and a control input Vc which sets the logic threshold voltage of the slave gate 12. Again, the logic threshold voltage or switching voltage of the gate is, for purposes here, the approximate DC voltage at which the logic input signals to the gate must transition for the output of the gate to change state. The control signal Vc adjusts the logic threshold voltage of the gates 12.

To make the logic threshold voltage of the gates 12 substantially equal to a known voltage, the master gate 11 has its control input and output thereof connected together and drives the control inputs of gates 12. The "logic" input of master gate 11 is driven by a known voltage, here the approximate desired logic threshold voltage of the gates 12. By virtue of component matching (all the gates are desirably formed in a common semiconductor substrate), the logic threshold voltages of gates 12 will substantially match the voltage applied to the "logic" input of master gate 11. Thus, for interfacing with TTL level signals, that voltage should be approximately 1.4 volts and for CMOS logic signals should be approximately one-half the power supply voltage which, for zero and five volt logic levels, is about 2.5 volts.

An exemplary circuit diagram of a master gate 11 and an inverter slave gate 12 is shown in FIG. 2. Transistors 21, 22 are disposed between power supply rails $V_{DD}$, $V_{SS}$, and power nodes 24, 25. Gates of transistors 26, 27 are connected together and to the control voltage input Vc A conventional inverter circuit is formed by transistors 21, 22 serially disposed with the power nodes 24, 25. The change in conductivity of transistors 26, 27, being substantially in opposite direction with respect each other due to the common control signal applied to the gates thereof, substantially affects the logic threshold voltage or switch point of the inverter formed by transistors 21, 22.

It is understood that any ordering of the transistors 21, 22, 26, 27 may be used and still achieve a desirable degree of threshold matching. The middle juncture of the string of transistors 21, 22, 26, 27 would still serve as the output of the master gate 11 for connecting to slave gates 12.

Figure 3:
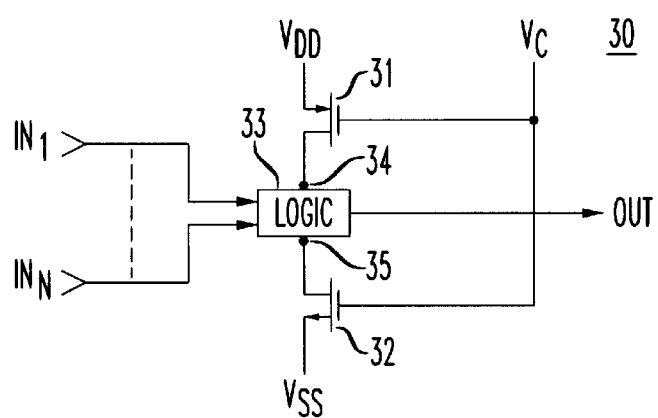
FIG. 3 is an exemplary circuit diagram of a variable logic threshold logic circuit with a master gate control circuit as shown in FIG. 2.

FIG. 3, discussed above, shows a generalized variable logic threshold voltage logic slave gate 30, suitable for use as the slave gate 12 in FIG. 1. Exemplary logic circuits that may be implemented by logic function 33 are shown in FIG. 4 (NOR) and FIG. 5 (NAND). Other logic functions and more inputs may be implemented as well, including XOR/XNOR, and complex logic functions including flip-flops.

It should be noted that the sizes of transistors 31, 32 should be substantially the same, or appropriately ratioed, as the sizes of corresponding transistors 21, 22 (FIG. 2) in the master gate 11 (FIG. 1). This assures that the logic threshold voltage of the gate 30 will be substantially the same as the voltage applied to master gate 11. It should also be noted that multiple output logic functions 33 may be used in this arrangement. Still further, it is desirable that the sizes of all the N-channel transistors be substantially the same or appropriately ratioed and the sizes of all the P-channel transistors be substantially the same or appropriately ratioed the same as the N-channel transistors are. The foregoing also applies to the gates 11, 12 shown in FIGS. 1 and 2.

Figure 6:
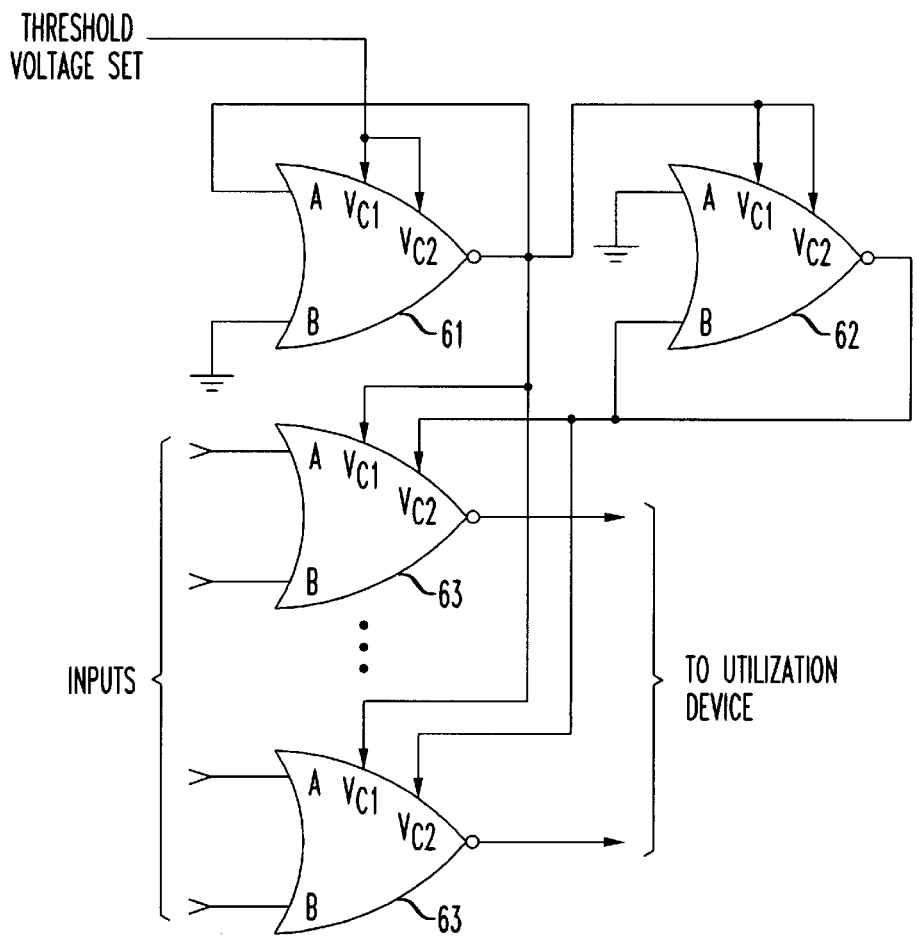
FIG. 6 is an exemplary circuit diagram of a multiple input logic gate having a master gate control circuit according to an alternate embodiment of the invention.

An alternative embodiment of the invention is shown in FIG. 6 where it may be desirable to have closer control of the threshold voltage of multiple gate inputs, particularly where at least two of the inputs may transition independently. Two gates 61, 62 (shown here as NOR gates but may be of any multiple input logic type) are connected together to provide two control signals $Vc_1$, $Vc_2$ for setting the threshold voltage of inputs A and B, respectively, of slave gates 63. As in the example shown in FIG. 1, the voltage applied to control inputs $Vc_1$ and $Vc_2$ of the first master gate 61 substantially sets the threshold voltage of the slave gates 63. It is understood that it may be desirable to have as many control signal inputs as there are logic inputs to the logic gate.

Figure 7:
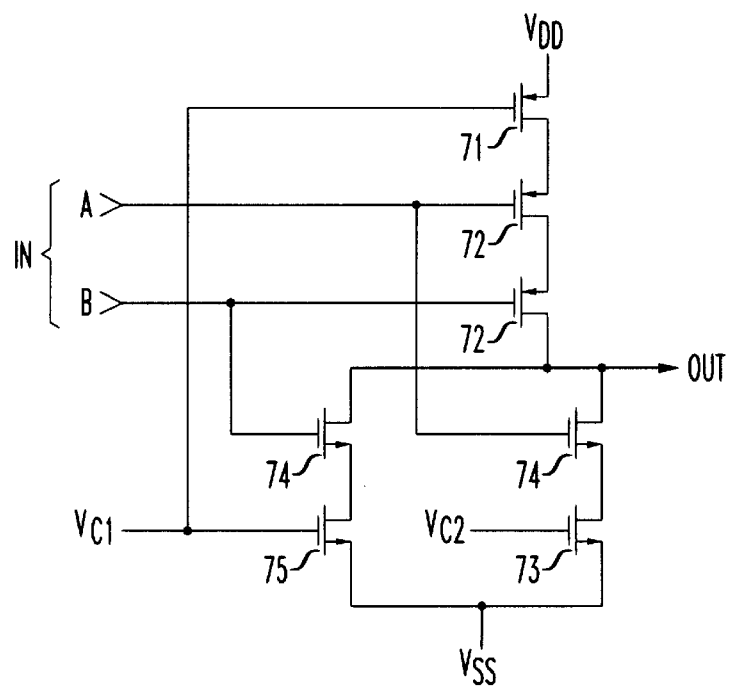
FIG. 7 is an exemplary circuit diagram of the alternative embodiment logic gate of FIG. 6.

An exemplary implementation of the master gates 61, 62 and slave gates 63 is shown in FIG. 7. This implementation is similar to that shown in FIG. 2 for control signal $Vc_1$ controlling the conductivity of transistors 71, 75. Instead of adding an additional P-channel transistor in series with transistors 71, 72 and controlled by $Vc_2$, a single transistor 73 is added in series with transistor 74 for setting the threshold voltage of input B. This technique of adding an additional transistor 73, responsive to the control signal and in series with one of the transistors (here 74) performing the logic function and of the same conductivity type can be extended to any number of inputs and to other logic functions, such as NAND. It is noted that in this example control signal $Vc_1$ additionally affects the threshold voltage of the B input.

Sizing of the transistors may be done as described above.

The ability to control the logic threshold voltage of a logic gate may be used, for example, to generate controllable pulse widths using a voltage ramp (not shown) and the variable logic threshold logic gate responsive to the ramp. The width of the pulse can be varied by adjusting the logic threshold voltage of the gate.

While the devices and circuits shown are exemplary, other topologies may be used to achieve the same results. For example, while FETs are shown, bipolar transistor transistors may be substituted and vice-versa to the extent such substitutions can be done. Further, voltage and current polarities can be reversed with the appropriate change in polarity for the active devices.

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

We claim:

1. An integrated circuit comprising a logic gate and a master gate, the logic gate comprising:

at least one transistor of a first conductivity type and at least one transistor of a second conductivity type in combination with additional first and second conductivity type transistors to provide a desired logic function;

a transistor of the first conductivity type, responsive to a control signal, with outputs in series with the at least one transistor of the first type;

a transistor of the second conductivity type, responsive to the control signal, with outputs in series with the at least one transistor of the second conductivity type; and a transistor, responsive to the control signal, in series with one of the additional first or second conductivity type transistors and of the same conductivity type;

wherein the logic gate has a logic threshold voltage that varies in response to the control signal;

a master gate, generating the control signal at an output, comprising:

first, second, third and fourth transistors, each having an input terminal and two outputs, the outputs being serially connected between a first power supply rail and a second power supply rail, the connection between a middle two of the transistors being the output;

wherein the master gate includes additional first and second conductivity type transistors to implement the same logic function as the logic gate, the input terminal of the second and third transistors being connected together and coupled to the output, the input terminal of the first and fourth transistors being connected together, the first and second transistors are of the first conductivity type and the third and fourth transistors are of the second conductivity type, and wherein the logic threshold voltage of the logic gate is substantially equal to a voltage applied to the input terminals of the first and fourth terminals of the master gate.

2. The master gate as recited in claim 1, further characterized the first and fourth transistors being connected to the first and second power rails, respectively.

3. The master gate as recited in claim 1, further characterized the first and third transistors being connected to the first and second power rails, respectively.

4. The master gate as recited in claim 1, further characterized the second and third transistors being connected to the first and second power rails, respectively.

5. The logic gate as recited in claim 1, wherein the logic function is a NAND function.

6. The logic gate as recited in claim 1, wherein the logic function is a NOR function.

7. An integrated circuit comprising a logic gate and a master gate, the logic gate having a logic threshold voltage, comprising:

a logic function having at least one input and at least one output, and first and second power nodes;

a first transistor having an input terminal and two output terminals, one output terminal connecting to a first power supply rail and the other connecting to the first power node;

a second transistor having an input terminal and two output terminals, one output terminal connecting to a second power supply rail and the other connecting to the second power node;

wherein the input terminals of the first and second transistors are connected together and couple to a control signal input for adjusting the logic threshold voltage of the logic gate;

a master gate, generating the control signal at an output, comprising:

first, second, third and fourth transistors, each having an input terminal and two outputs, the outputs serially connected between a first power supply rail and a second power supply rail, the connection between a middle two of the transistors being the output;

wherein the master gate includes additional first and second conductivity transistors to implement the same logic function as the logic gate, and the input terminal of the second and third transistors being connected together and coupled to the output, the input terminal of the first and fourth transistors being connected together, the first and second transistors are of the first conductivity type and the third and fourth transistors are of the second conductivity type, and wherein the logic threshold voltage of the gate is substantially equal to a voltage applied to the input terminals of the first and fourth input terminals.

8. The master gate as recited in claim 7, further characterized the first and fourth transistors being connected to the first and second power rails, respectively.

9. The master gate as recited in claim 7, further characterized the first and third transistors being connected to the first and second power rails, respectively.

10. The master gate as recited in claim 7, further characterized the second and third transistors being connected to the first and second power rails, respectively.

11. The logic gate as recited in claim 7, wherein the logic function is a NAND function.

12. The logic gate as recited in claim 7, wherein the logic function is a NOR function.

* * * * *